United States Patent [19]
Easton

[11] Patent Number: 4,532,839
[45] Date of Patent: Aug. 6, 1985

[54] METHOD FOR SIMULTANEOUSLY CUTTING A PLURALITY OF CIRCUIT BOARDS

[75] Inventor: Thomas C. Easton, Portland, Oreg.

[73] Assignee: Tektronix, Inc., Beaverton, Oreg.

[21] Appl. No.: 564,817

[22] Filed: Dec. 21, 1983

[51] Int. Cl.³ .............................................. B26D 7/01
[52] U.S. Cl. ........................................... 83/29; 83/49; 83/451; 269/21
[58] Field of Search .................... 83/29, 39, 41, 48, 49, 83/71, 374, 451, 925 CC; 269/21; 409/84, 189, 205, 225, 226

[56] References Cited

U.S. PATENT DOCUMENTS

| | | | |
|---|---|---|---|
| 3,028,786 | 4/1962 | Wanielista | 269/21 |
| 3,354,769 | 11/1967 | Abramson et al. | 83/451 X |
| 3,453,957 | 7/1969 | Hamilton | 269/21 X |
| 3,486,441 | 12/1969 | Hillman et al. | 269/21 X |
| 3,496,814 | 2/1970 | Bessim | 83/29 |
| 3,711,082 | 1/1973 | Seidenfaden | 269/21 |
| 3,742,802 | 7/1973 | Maerz | 83/925 CC |
| 4,313,478 | 2/1982 | Suzuki | 83/451 X |

*Primary Examiner*—James M. Meister
*Attorney, Agent, or Firm*—John Smith-Hill

[57] ABSTRACT

The method of cutting a plurality of boards or parts (20) from a number of stacked panels (10) which includes placing the panels upon a perforated fixture (2) including a plenum (14) such that the area beneath the perforated surface (4) may be evacuated. The stack of panels (10) are cut into boards or parts (20) the desired size and shape with the exception of a small tab (22) connecting each board or part (20) such that the entire panel (10) remains a unit. An impermeable sheet (24) such as plastic is placed over the top of the partially cut panels (10) and the space (14) beneath the partially cut panels is evacuated holding the parts in position. The tabs (22) are then cut and the boards or parts (20) removed.

7 Claims, 4 Drawing Figures

METHOD FOR SIMULTANEOUSLY CUTTING A PLURALITY OF CIRCUIT BOARDS

DESCRIPTION

TECHNICAL FIELD

This invention relates to the apparatus for and method of cutting a plurality of various sized and shaped pieces of circuit boards from a stack of panels of the core material. The apparatus eliminates the necessity of fabricating a special jig for each run of pieces.

BACKGROUND ART

Small manufactured pieces, such as circuit boards, have been traditionally cut to specification from larger manufactured panels of the desired base material. Obviously, the greater the number of panels that may be cut into identical boards or pieces at one time the lesser the total time involved both in set up and in manufacturing and thus a reduction in the cost per unit results.

In the past, a plurality of panels have been stacked upon a supporting fixture and then, using a template or other device to determine the location and shape of the resultant boards, sufficient pins were driven through the panels such that when the panels were cut there would be two pins in each stack of resulting boards. The securement pins thus assured that the boards would be accurately cut, would remain stacked and would be relatively easily removed as a unit. Obviously, the cutting, once the panels and resultant boards were laboriously secured by the pins, could be accomplished by a numerical control machine if such were desired.

It becomes apparent that although this heretofore utilized method of cutting a multiple of small items such as circuit boards from larger panels does permit the utilization of automatic machines to simultaneously cut a stack of the panels, the setup time was necessarily slow and meticulous work.

DISCLOSURE OF THE INVENTION

A perforate table fixture overlying a plenum and including a plurality of upstanding pins is used to accurately locate and hold secure a stack of material to be cut into smaller pieces. The pieces are partially cut with a numerically controlled or other automatic device, a sheet of imperforate material is placed over the stack, a vacuum is created within the plenum holding the entire stack of material in a fixed position and the remaining tab portions are cut, completing the operation.

BEST MODE FOR CARRYING OUT THE INVENTION

Figure 1:
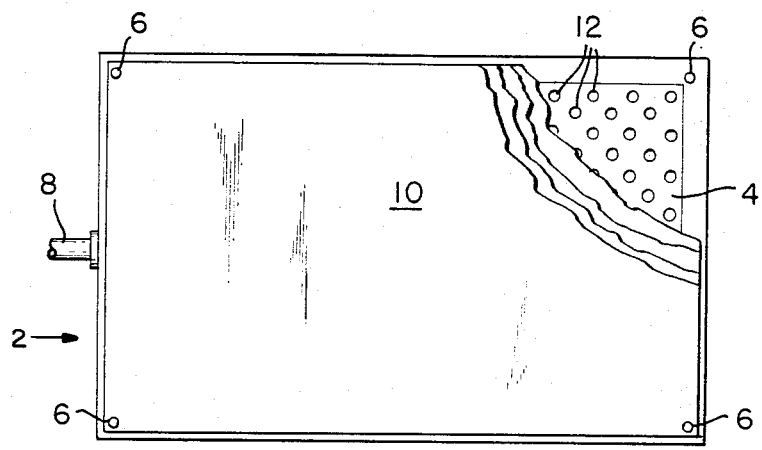
FIG. 1 is a plan view of a fixture for use in the present invention, including a stack of panels to be cut, overlying a portion of the novel fixture.

As seen in FIG. 1, the apparatus which allows the largely automatic cutting of a plurality of panels into smaller units includes as its primary element a fixture, generally designated as 2, which includes a perforate upper surface 4, a plurality of upstanding locating pins 6 and a connection 8 to a vacuum source, as explained hereinafter. A plurality of full sized panel members 10 are placed upon the perforate surface 4 located and secured by pins 6, where they will be cut into the appropriate sized and shaped boards by means of a numerically controlled device.

Figure 2:
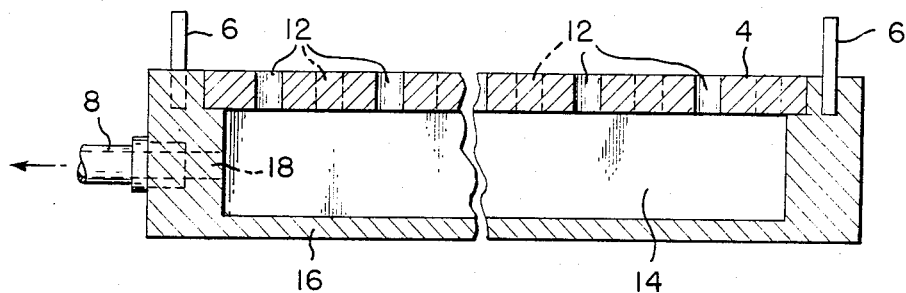
FIG. 2 is a sectional elevation view of the fixture of FIG. 1.

As seen in FIG. 2, which is a partial sectional view of the fixture of FIG. 1, the perforate upper surface 4 includes a plurality of bores 12 in fluid communication with a plenum 14 created by a lower and side wall surface 16. A conduit 18, in commmunication with conduit 8, leads to a source of negative air pressure. In use, as explained hereinafter, the plenum 14 is evacuated at the appropriate time, thus holding the individual elements in position during the final cutting step.

Figure 3:
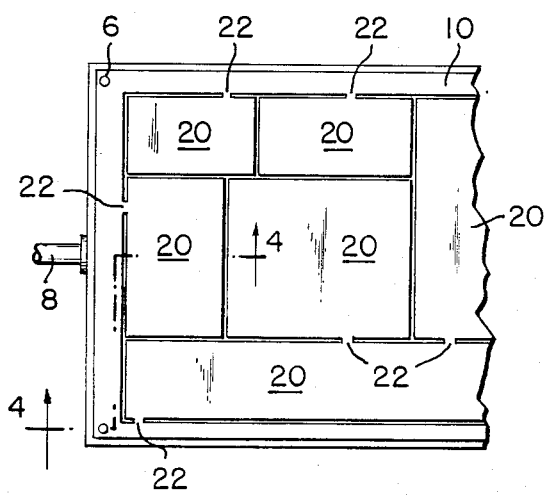
FIG. 3 is a partial plan view similar to FIG. 1 but depicting a plurality of parts cut from the panels with the retainer tabs left intact.

As seen in FIG. 3, the panels are again designated as 10 but there is shown a plurality of individual elements, in this case circuit boards, in particular designated as 20, which have been partially cut from the stack of panel members 10. Each of the individual boards is left secured to the panel itself by means of tabs 22, one for each board, such that the stack of panels and each individual panel remains intact. It is to be emphasized that the majority of the perimeter of each of the boards 20 has been cut free.

Figure 4:
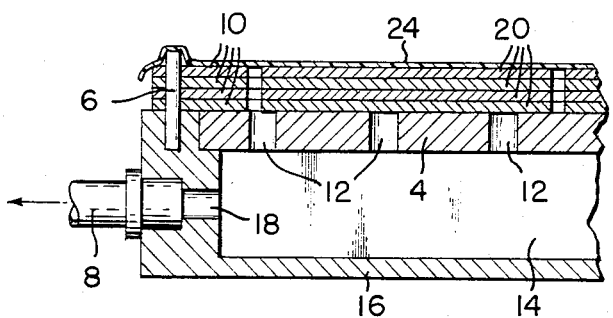
FIG. 4 is a vertical sectional view showing the cut pieces overlaid by a sheet of imperforate film material allowing the final cut.

In practice, the operator, to cut circuit boards by the present invention, places a stack of panels 10 upon the fixture 4 utilizing the locator pins 6 and then, utilizing a preprogrammed numerical control router or cutter, has a stack of the boards individually cut about the majority of their perimeter. Following the initial cutting, the operator then will place a sheet of imperforate film 24 (see FIG. 4) over the entire stack of panels and a negative pressure is created in the plenum 14. The negative pressure acting against the imperforate film holds the stack of panels in position and the numerical controlled machine is again activated to remove the tabs. The fact that the sheet of film 24 is in an overlying position and is to a large extent imperforate, the exception being that small portion where the tabs are cut, all of the pieces are held in place until the cutting is completed. The vacuum is terminated and the individual stacks of boards are removed.

In addition to the economy realized in the use of the present method, the waste material, a fine powder-like sawdust is removed from the work area by the vacuum.

Thus as can be seen, the present invention comprises a unique efficient method of automatically cutting a plurality of individual elements from a stack of panels of stock material.

I claim:

1. A method of cutting circuit boards comprising the steps of:
    placing a stack of panels of board material upon locating pins;
    cutting the major portion of the peripheral outline of a plurality of circuit boards leaving a tab on each board;
    placing an impermeable sheet over the stack of panels;
    applying a vacuum to the underside of the stack;
    cutting the tabs;
    removing the circuit boards.

2. A method as in claim 1 wherein the locating pins are mounted to a perforated plate having a vacuum chamber therebeneath.

3. A method of cutting at least one board having a predetermined peripheral outline from each of a plurality of panels of stiff material, comprising the steps of:

forming the panels into a stack;

restraining the panels against lateral movement relative to each other;

cutting through the stack along a major portion of the peripheral outline of each board, leaving at least one tab connecting the board to the rest of the panel so that the board is restrained against lateral movement relative to the rest of the panel;

placing an impermeable sheet over the stack of panels;

applying a vacuum to the underside of the stack; and severing the tabs.

4. A method according to claim 3, wherein the step of restraining the panels against lateral movement relative to each other is performed by placing the stack of panels upon locating pins.

5. A method of dividing a plurality of panels of stiff material each into a peripheral frame portion and an inner board portion having a predetermined peripheral outline, comprising the steps of:

forming the panels into a stack;

restraining the panels against lateral movement relative to each other;

cutting through the stack along a major portion of the peripheral outline of said inner board portion leaving at least one tab connecting the inner board portion to the peripheral frame portion;

placing an impermeable sheet over the stack of panels;

applying a vacuum to the underside of the stack; and severing the tabs.

6. A method according to claim 5, wherein the step of restraining the panels against lateral movement relative to each other is accomplished by placing the stack of panels upon locating pins.

7. A method according to claim 5, wherein each panel has at least one locating hole in its frame portion, the locating holes of the panels being in register when the panels are formed into a stack, and the step of restraining the panels against lateral movement relative to each other is accomplished by inserting pins through the registering locating holes.

* * * * *